United States Patent
Kutzner et al.

(10) Patent No.: US 9,557,349 B2
(45) Date of Patent: Jan. 31, 2017

(54) MEASURING SYSTEM FOR CONTINUOUSLY MONITORING A HIGH-VOLTAGE BUSHING

(71) Applicant: SIEMENS AKTIENGESELLSCHAFT, Munich (DE)

(72) Inventors: Ruediger Kutzner, Zirndorf (DE); Marc Weber, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 14/762,989

(22) PCT Filed: Jan. 14, 2014

(86) PCT No.: PCT/EP2014/050522
§ 371 (c)(1),
(2) Date: Jul. 23, 2015

(87) PCT Pub. No.: WO2014/114516
PCT Pub. Date: Jul. 31, 2014

(65) Prior Publication Data
US 2015/0355237 A1     Dec. 10, 2015

(30) Foreign Application Priority Data

Jan. 23, 2013   (EP) .................................... 13152296

(51) Int. Cl.
*G01R 13/04*     (2006.01)
*G01R 1/36*      (2006.01)
(Continued)

(52) U.S. Cl.
CPC ............. *G01R 1/36* (2013.01); *G01R 19/0092* (2013.01); *G01R 31/1227* (2013.01)

(58) Field of Classification Search
CPC ....... G01R 11/24; G01R 11/25; G01R 22/066; G01R 22/068; G01R 1/203; G01R 15/146; G01R 19/0007; G01R 1/22
See application file for complete search history.

(56) References Cited

U.S. PATENT DOCUMENTS

| 4,757,263 A * | 7/1988 | Cummings, III ...... G01R 15/14 324/126 |
| 2003/0184325 A1 | 10/2003 | Koch |
| 2011/0234243 A1* | 9/2011 | Santos ............... G01R 31/1227 324/659 |

FOREIGN PATENT DOCUMENTS

CN    201654071 U    11/2010
WO      0169272 A2    9/2001

OTHER PUBLICATIONS

Küchler A. et al; Hochspannungstechnik: Grundlagen-Technologie-Anwendungen, Chapter 6.4.8.2, Version 2009, ISBN 978-3-540-78412-8; 2009.

(Continued)

*Primary Examiner* — Tung X Nguyen
(74) *Attorney, Agent, or Firm* — Laurence Greenberg; Werner Stemer; Ralph Locher (57) ABSTRACT

A measuring system for continuously monitoring a high-voltage bushing provides for multi-stage, secure protection. The system includes a measuring circuit, a connection plug, a connection cable, and a three-stage protective circuit. When overvoltages occur at the measurement connection, each protective stage can produce a short circuit at the measurement connection to limit the voltage. A first protective stage responds at a response voltage U1. A second protective stage connected between the first stage and the measurement connection responds at a higher response voltage U2. A low-pass filter in the first protective stage decouples the first and second protective stages. The first (Continued)

stage responds to overvoltages at operating frequency, the second stage responds to high-frequency overvoltages. A third protective stage is connected between the measurement connection and the first protective stage in parallel with the measurement connection and includes a mechanical switch for short-circuiting when a third response voltage is present.

8 Claims, 4 Drawing Sheets

(51) Int. Cl.
    *G01R 19/00*     (2006.01)
    *G01R 31/12*     (2006.01)

(56)     References Cited

OTHER PUBLICATIONS

Liebschner M. et al., Online-Monitoring of Capacitance and Dissipation Factor of High Voltage Bushings at Service Temperature, 15th ISH International Symposium on High Voltage Engineering, Ljubljana, 2007, 2007.
ABB Inc, 1128 S. Cavalier Drive, Alamo, TN 38001, USA; Bushing Potential Device/type PBA2, Quelle: Internet http://www05.abb.com/global/scot/scot252.nsf/veritydisplay/e1eb60aa5c6c638b85256f96006e3ca8/$file/izua%20.

* cited by examiner

MEASURING SYSTEM FOR CONTINUOUSLY MONITORING A HIGH-VOLTAGE BUSHING

BACKGROUND OF THE INVENTION

Field of the Invention

The present invention relates to a measuring system for continuously monitoring a high-voltage bushing in particular a housing bushing of a power transformer, including a measuring circuit for monitoring the high-voltage bushing, a connecting plug for connecting the measuring circuit to a measuring connection of the high-voltage bushing, a connecting cable for connecting the measuring circuit to the connecting plug, and a protection circuit for protecting the measuring connection from over-voltages. The protection circuit is designed to establish a short circuit between a high-voltage terminal and a ground terminal of the measuring connection if an overvoltage occurs. The protection circuit includes a first protection stage having a first response voltage and a second protection stage having a second response voltage connected in parallel with the first protection stage. The second protection stage is connected between the measuring connection and the first protection stage and the first protection stage includes a low-pass filter.

Transformers and their components are important parts of the power supply network. Their failure may result in the shutdown of power plants or network sections, which may entail considerable expense. The breakdown of high-voltage bushings is one of the most frequent causes of failure in transformers, in particular power transformers. Up to now, they have been inspected only during routine maintenance. This has been problematic due to the long intervals between the measurements, which did not always allow the detection of faults in a timely manner. Recently, however, there has been an increasing demand for measuring systems to enable the continuous monitoring (online monitoring) of high-voltage bushings. A brief overview may also be found in "Hochspannungstechnik: Grundlagen-Technologie-Anwendungen" (High-voltage technology: Basics-technology-applications) by Andreas Küchler (Chapter 6.4.8.2 of the 2009 edition, ISBN 978-3-540-78412-8). Additional descriptions of such measuring systems and of the requirements and options are in a plurality of technical articles, for example, in Liebschner et al. "Online-Monitoring of Capacitance and Dissipation Factor of High Voltage Bushings at Service Temperature" (15th ISH International Symposium on High Voltage Engineering, Ljubljana, 2007).

High-voltage bushings generally have a measuring connection for electrical measurements, which is connected to the outermost capacitive layer coating of the high-voltage bushing and which may be used for connecting a measuring system for measuring capacitance, the dissipation factor, insulation resistance, or polarization and depolarization currents.

The measuring connection itself has a ground terminal which is often formed by the grounded housing or a grounded flange, and a high-voltage terminal which is insulated and routed to the outside through the housing of the high-voltage bushing. If no measuring system is connected to the measuring connection, the ground terminal and the high-voltage terminal of the measuring connection must be short-circuited. Otherwise, the insulation of the measuring connection would be destroyed over time due to the high voltage between the high-voltage terminal and the ground terminal, subsequently resulting in the insulation in the interior of the bushing being destroyed, resulting in a breakdown of the bushing and thus the failure of the transformer. Considerable damage to switchgear or injury to persons in the vicinity may also occur. A voltage present at the measuring connection which results in destruction of the insulation of the measuring connection immediately or only after being present for a longer time is referred to below as overvoltage.

When the measuring system is connected, a measuring load in the measuring circuit of the measuring system limits the voltage present at the measuring connection, so that the insulation of the measuring connection is not damaged. However, in the event of the loss of the measuring load, for example, due to corrosion, aging, or a cable break, the above-described fault mechanisms would occur again. Therefore, a permanently connected measuring system must be considered to be an additional fault source for the failure of a high-voltage bushing. In addition, during the operation of such a measuring system, the measuring connection is susceptible to lightning strikes in the vicinity. These lightning strikes may also result in overvoltages at the measuring connection, thus damaging the measuring connection or the measuring system. Therefore, precautions must be taken to protect the measuring connection from overvoltage, whether through the loss of the measuring load or due to lightning strikes.

Such a measuring system which measures the voltage present at the high-voltage bushing is described in the company publication "ABB, Bushing Potential Device, Type PBA2."

There, a spark gap protects the measuring connection from overvoltages. The measuring connection may also be short-circuited manually using a grounding switch.

U.S. Pat. No. 4,757,263 A describes a device for monitoring the insulation of high-voltage facilities. Here, a measuring circuit is protected from overvoltage by two parallel varistors.

CN 201 654071 U describes a measuring connection including a protection circuit made up of a pair of diodes connected back-to-back and a spark gap which is connected in parallel with them.

The known related art is disadvantageous in that these protection circuits are not sufficient to meet the requirements of the operators of transformers having such high-voltage bushings for the failsafe long-term protection of the measuring connection.

BRIEF SUMMARY OF THE INVENTION

The object of the present invention is to provide a measuring system which ensures a high level of protection of the measuring connection from overvoltages.

This object is achieved via the means of the present invention as claimed.

For this purpose, a measuring system is provided which is suitable for continuously monitoring a high-voltage bushing, in particular a housing bushing of a power transformer, and which includes at least the following components:
  a measuring circuit for monitoring the high-voltage bushing,
  a connecting plug for connecting the measuring circuit to a measuring connection of the high-voltage bushing,
  a connecting cable for connecting the measuring circuit to the connecting plug, and
  a protection circuit for protecting the measuring connection from overvoltages, which is designed to establish a short circuit between a high-voltage terminal and a ground terminal of the measuring connection if an overvoltage occurs, wherein the protection circuit includes a first protection stage having a first response voltage and a second protection stage having a second response voltage, which is electrically connected in parallel with the first protection stage.

Within the context of the present invention, a short circuit is to be understood as meaning the high-voltage terminal and the ground terminal being electrically connected together in such a way that a voltage is present at the measuring connection which is non-critical for its insulation.

According to the present invention, it is provided that the second response voltage is greater than the first response voltage, that the second protection stage is connected between the measuring connection and the first protection stage and that the first protection stage includes a low-pass filter. The first and the second protection stages thus preferably respond to different events triggering an overvoltage and are used simultaneously as a mutual fallback level. This ensures a particularly high degree of protection of the measuring connection from overvoltages. In addition, a third protection stage is connected between the measuring connection and the first protection stage in parallel with the measuring connection and includes a mechanical switch via which the short circuit may be established if a third response voltage is present. Since mechanical switches are considered to be robust and failsafe, even better protection is ensured as a result.

Preferably, the first protection stage in a circuit branch connecting the high-voltage terminal to the ground terminal includes a varistor or a suppressor diode. These components switch rapidly and are able to discharge an overvoltage safely to ground and are also economical.

In an additional preferred embodiment, the second protection stage in a circuit branch connecting the high-voltage terminal to the ground terminal includes a spark gap. Spark gaps have a particularly high current-carrying capacity and thus provide reliable protection even at high currents.

In one advantageous embodiment of the present invention, it is provided that the third protection stage includes a series circuit made up of a spark gap, a rectifier, and a coil, and the mechanical switch is switchable via a current flowing through the coil. The switch and the coil thus form a reed relay. As a result, the switch is closed when the response voltage is present and the resulting current flows through the coil, thus establishing the short circuit of the measuring connection safely and without requiring manual intervention, thereby achieving further improved protection.

In addition, it is preferred that the reed relay is bistable. Once the switch has been closed, it therefore remains closed even if current is no longer flowing through the coil. If the third protection stage responds, which is preferably the case in the event of a failure of the first and second protection stages and the presence of an overvoltage which is greater than the response voltage U3, the short circuit is therefore established in a particularly safe and permanent manner.

It is also advantageous that at least one of the protection stages is designed to be redundant. Preferably, the first and/or the second protection stages are designed to be redundant and thus form additional failure protection.

In addition, one advantageous embodiment of the present invention provides that the protection circuit is integrated into the connecting plug. Preferably, the first, the second, and the third protection stages of the protection circuit are integrated into the connecting plug. A connecting cable from the connecting plug to the protection circuit is therefore superfluous, thus eliminating a potential cause of failure.

The connecting plug may also be sealed in such a way that it protects the measuring connection from the penetration of air or moisture, and/or may have a mechanical cover protection which prevents the connecting plug from being able to be removed unintentionally or due to vibration of the measuring connection.

BRIEF DESCRIPTION OF THE SEVERAL VIEWS OF THE DRAWING

The present invention is described in greater detail based on the drawings. They depict.

Corresponding parts are provided with the same reference numerals in all figures.

DESCRIPTION OF THE INVENTION

Figure 1:
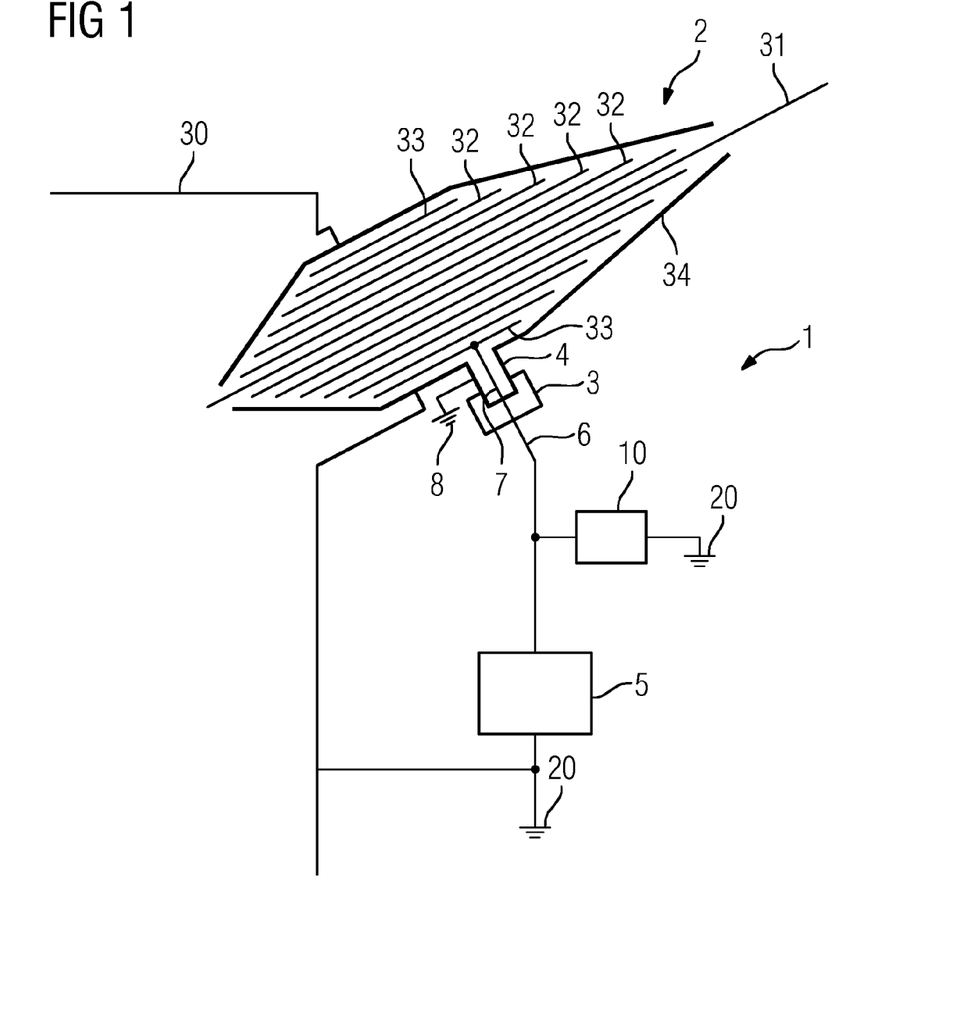
FIG. 1 a schematic representation of a measuring system connected to a bushing of a transformer.

FIG. 1 depicts a measuring system 1 according to the present invention which is connected to the measuring connection 4 of the high-voltage bushing 2 of a power transformer 30. A conductor 31 carrying a high voltage is routed out of a transformer 30. A high-voltage bushing 2, here having a capacitive field control, is used for insulating the conductor 31 from the grounded housing of the transformer 30. Conductive cylindrical control coatings 32, 33 which are graduated in length are used for controlling the electric fields, in particular at the ends of the high-voltage bushing 2. The outermost control coating 33 is also referred to as the ground coating, since it is closest to ground potential. Without a connected measuring system 1, the ground coating 32 is generally grounded. A dielectric, which is not depicted, is present between the control coatings 32, 33. Thus, adjacent control coatings 32, 33 act as capacitors. The space between the conductor 31 and the ground coating 33 is thus divided into a plurality of partial capacitances. To provide a better illustration, only a few control coatings 32 are shown here.

The bushing has an insulating housing 34. An electrical connection is insulated and routed from the ground coating 33 through the bushing housing 34 to the outside and forms the high-voltage terminal 7 of a measuring connection 4. The outer housing of the measuring connection 4 is generally grounded and is used as a ground terminal 8.

A measuring system 1 for monitoring the high-voltage bushing 2 is connected to the measuring connection 4. A connecting plug 3 establishes the mechanical and electrical contact with the measuring connection 4. A connecting cable 6 leads from the connecting plug 3 to the measuring circuit 5. The connecting cable 6 is, for example, designed as a coaxial cable, wherein the inner connector 42 is connected to the high-voltage terminal 7 and the outer conductor 41 is connected to the ground terminal 8. A protection circuit 10 is connected to the connecting cable 6. To provide a better illustration, the protection circuit 10 is shown here between the connecting plug 3 and the measuring circuit 5. However, it may also be integrated into the measuring circuit or into the connecting plug.

Figure 2:
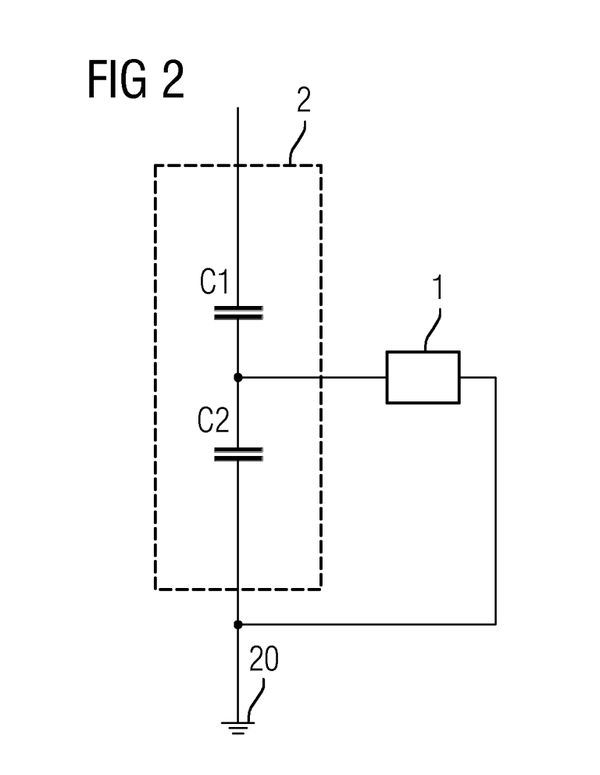
FIG. 2 an equivalent circuit diagram of the arrangement according to FIG. 1.

FIG. 2 depicts an equivalent circuit diagram of the arrangement according to FIG. 1. The bushing 2 is depicted as a series connection of capacitors C1 and C2. The capacitor C2 corresponds to the capacitance made up of the ground coating 33 and ground 20, and the capacitor C1 corresponds to the capacitance of the interconnection of all other control coatings 33.

A tap between the capacitors C1 and C2 forms the high-voltage terminal 7 of the measuring connection 4. The high-voltage terminal 7 is thus electrically connected to the ground coating 33. The measuring system 1 is inserted into a circuit between this tap and ground 20.

Figure 3:
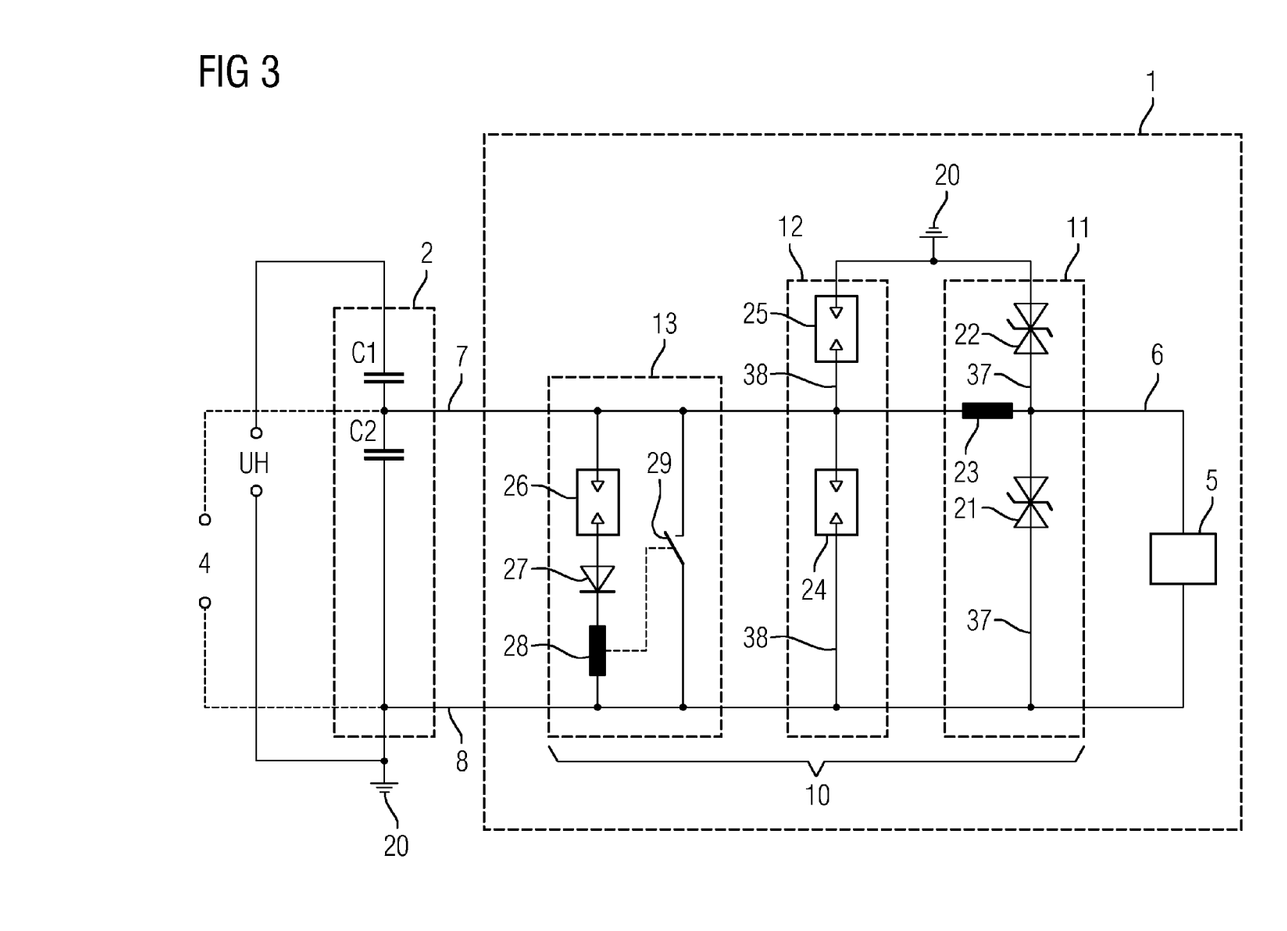
FIG. 3 a circuit diagram of a measuring system according to the present invention.

FIG. 3 depicts a circuit diagram of a measuring system 1 according to the present invention, in particular the protection circuit 10. Here, the high-voltage bushing is again depicted in the equivalent circuit diagram of the capacitors C1 and C2.

A high voltage UH is present between the innermost layer coating, i.e., the one nearest to the conductor 31 carrying high voltage, and the ground 20. A measuring circuit 5 as known from the related art is connected in parallel with the measuring connection 4. The capacitance or ohmic resistance of the measuring circuit 5 is sized such that the voltage present at the measuring connection 4 is reduced to such an extent that it is able to be dissipated by the insulation 35 of the measuring connection 4 between the high-voltage terminal 7 and the ground terminal 8 without this insulation 35 possibly being damaged due to partial discharges. The level that this voltage may reach for this purpose depends on the sizing of the insulation 35, but is typically several hundred volts.

Three protection stages 11, 12, 13 of a protection circuit 10 are each connected in parallel with the measuring connection 4 between the measuring connection 4 and the measuring circuit 5.

A suppressor diode 21 is connected in parallel with the measuring connection 4 in a circuit branch 37. Below a first response voltage U1, the resistance of the suppressor diode 21 is high, i.e., it has a high ohmic resistance which is significantly higher than that of the measuring circuit 5. If the first response voltage U1 is exceeded, for example, at 100 volts, it becomes conductive, its ohmic resistance decreasing by multiple orders of magnitude, and thus short-circuits the high-voltage terminal 7 and the ground terminal 8 of the measuring connection. The ohmic resistance of the suppressor diode 21 is then so low that a voltage in the range of the first response voltage U1 arises at the measuring connection 4, which is non-critical for its insulation 35. Depending on the type of high-voltage bushing and the level of the high voltage, a current of several milliamperes up to 100 milliamperes flows through the suppressor diode. A second, identical suppressor diode 22 is connected in parallel with the suppressor diode 21 and thus forms a redundant branch of the first protection stage 11. Instead of suppressor diodes 21, 22, varistors or components having a current-voltage characteristic similar to the suppressor diode 21 may be used. A low-pass filter 23, here, in the form of an inductor, is connected between the circuit branch 37 and the high-voltage terminal 7. The low-pass filter 23 is sized such that frequencies which correspond to the operating frequency of the transformer 30, i.e., approximately 50 to 60 Hertz, pass unhindered, whereas clearly higher frequencies are attenuated. The low-pass filter 23 and one or both suppressor diodes 21, 22 together form the first protection stage 11.

A second protection stage 12 is connected between the first protection stage 11 and the measuring connection 4. A circuit branch 38 connected in parallel with the measuring connection 4 includes a spark gap 24 which, for example, may be a protective spark gap or a gas discharge tube. Below a second response voltage U2, its resistance is high, i.e., it has a high ohmic resistance which is significantly higher than that of the measuring circuit 5. If the second response voltage U2 is exceeded, it becomes conductive, its ohmic resistance decreasing by multiple orders of magnitude, and establishes a short circuit between the high-voltage terminal 7 and the ground terminal 8. The second response voltage U2 is higher than the first response voltage U1 and is, for example, 150 volts. A second, identical spark gap 25 is connected in parallel with the circuit branch 38 and thus forms a redundant branch of the second protection stage 12. Spark gaps 24, 25 are available as components which already contain two separate spark gaps 24, 25. A redundantly designed second protection stage 12 is thus highly compact and simple to implement. However, the redundant branches of the first and/or second protection stages 11, 12 may also be omitted in the case of lower safety requirements.

Overvoltages at the measuring connection 4 may have various causes. One is the loss of the measuring load. This happens if a defect occurs at the measuring circuit 5, for example, caused by corrosion or aging of components, or in the case of a break in the connecting cable 6 between measuring connection 4 and the measuring circuit 5 or protection circuit 10. If the break in the connecting cable 6 occurs between the measuring connection 4 and the protection circuit 10, the protection circuit 10 is no longer able to perform its function, i.e., of establishing a short circuit at the measuring connection 4. Therefore, the protection circuit 10 must be situated as close as possible to the measuring connection 4, preferably integrated into the connecting plug 3. In the event of a break in the connecting cable 6 between the protection circuit 10 and the measuring circuit 5 or in the event of a defect in the measuring circuit 5, an overvoltage may occur at the measuring connection 4. This overvoltage is an AC voltage having the operating frequency of the transformer 30. Such an event is therefore also referred to as an "operating-frequency" event. This operating-frequency AC voltage is able to pass the low-pass filter 23 virtually unhindered. This overvoltage is thus present at both the first protection stage 11 and at the second protection stage 12 of the protection circuit 10. If the overvoltage exceeds the response voltage U1 of the first protection stage 11, at least one of the two suppressor diodes 21, 22 becomes conductive, thus short-circuiting the measuring connection 4 and limiting the voltage at the measuring connection 4 to a value which is harmless to the insulation 35 of the measuring connection 4. The suppressor diode 21 or an equivalent component should be designed in such a way that it is able to carry the current now flowing over it for a longer period, for example, up to the next planned maintenance of the bushing 2, without being destroyed. The defect in the connecting cable 6 or in the measuring circuit 5 may now be remedied during the next maintenance of the bushing 2. Afterwards, the voltage at the measuring connection 4 will again be limited by measuring circuit 5.

An additional possible cause of an overvoltage at the measuring connection 4 may be a lightning strike in or in the vicinity of the bushing 2. Such a lightning strike is a brief, transient event, which may result in very high overvoltages at the measuring connection 4. However, in contrast to the previously described event, frequencies occur which are considerably above the operating frequency of the transformer 30. Therefore, such an event is termed "high-frequency." The low-pass filter 23 attenuates these frequencies, so that the overvoltage occurring at the suppressor diode(s)

21, 22 of the first protection stage 11 has a lower amplitude and/or a time delay. However, at the second protection stage 12, this overvoltage is undelayed and at full amplitude. Therefore, despite the higher response voltage U2, one or both of the spark gaps 24, 25 becomes conductive and short-circuits the measuring connection 4. Without the low-pass filter 23, in the case of such a high-frequency event, the first protection stage 11 would switch instead of the second protection stage 12, since, on the one hand, it has a lower response voltage U1, and on the other hand, the suppressor diodes 21, 22 generally have a more rapid response behavior, i.e., a shorter switchover time from high resistance to conductive, than the spark gaps 24, 25. Since much higher voltages may occur in a high-frequency event than in an operational-frequency event, and due to the frequency dependency of the capacitance C1, the currents flowing via the short circuit are also higher there and may amount to several hundred amperes. Such high-frequency events are connected by the circuit arrangement of the first and second protection stages 11, 12 by means of the spark gaps 24, 25, which are able to carry considerably higher currents than the suppressor diodes 21, 22. The first protection stage 11 thus preferably switches in the case of operating-frequency overvoltages, and the second protection stage 12 switches in the case of high-frequency events. If the first protection stage 11 should fail, the second protection stage 12 also switches in the case of an operating-frequency event, but only in the case of the higher response voltage U2. If the second protection stage 12 fails, the first protection stage 11 also switches in the case of a high-frequency event, but is time-delayed by the low-pass filter 23.

If the event triggering the overvoltage has ended, which may be the case in the event of a lightning strike after just a few fractions of a second, and in the case of a repair, for example, of a break in the connecting cable 6, may even take months, the voltage present at the first or second protection stage 11, 12 again falls below the response voltages U1, U2. The resistance of the spark gaps 24, 25 or the suppressor diodes 21, 22 again becomes high, and the short circuit of the measuring connection is again opened. The short circuit established by the first or second protection stage 11, 12 is thus reversible and is opened if the event triggering the overvoltage has ended.

The first and the second protection stages 11, 12 thus respond to different events; however, they act as a fallback level for each other if one of the protection stages 11, 12 fails.

If a lightning strike occurs after a failure of the second protection stage 12, the first protection stage 11 may be destroyed by the high currents occurring and also fail. Since, in addition, little is currently known about the long-term behavior of the components used in the first or second protection stage 11, 12, in particular if they are operated over a longer period in the connected, i.e., conductive, state, it cannot be ruled out that both protection stages 11, 12 fail. For this case, a third protection level 13 is provided which, however, may also be omitted for lower safety requirements.

The third protection stage 13 is connected in parallel with the measuring connection 4, between it and the second protection stage 12, and includes a series circuit made up of a spark gap 26, a rectifier 27, here, a diode, and a coil 28. The spark gap 26 is connected to the high-voltage terminal 7, and the coil 28 is connected to the ground terminal 8. A mechanical switch 29 is connected in parallel with this series circuit between the high-voltage terminal 7 and the ground terminal 8. The switch 29 and the coil 28 form a reed relay. If no current flows through the coil 28, the switch 29 is open.

If a direct current or a rectified alternating current flows through the coil 28, the switch 29 is closed by the magnetic field of the coil 28 being generated as a result, and thus establishes a short circuit of the measuring connection 4. The spark gap 26 has a response voltage U3 at which it becomes conductive. The current which then flows through the spark gap 26 is rectified by the rectifier 27 and generates a magnetic field in the coil 28. The coil 28, in particular its number of windings, is sized in such a way that the current which then flows causes the switch 29 to be closed. The current now flows via the switch 29, whereby the voltage at the measuring connection 4 falls below the response voltage U3, and the spark gap 26 is extinguished and its resistance again becomes high. Current then no longer flows through the coil 28, and the magnetic field collapses. The switch 29 is bistable and thus remains in the closed state, even if the magnetic field has collapsed. The switch 29 may again be opened via a magnetic field which is opposite to the magnetic field required to close the switch 29. This may be achieved using a permanent magnet which is kept at a suitable location in the vicinity of the switch 29. If the protection circuit 10 or even just the protection stage 13 is integrated into the connecting plug 3, a marking may be provided on the connecting plug 3 which indicates where and in which orientation a permanent magnet must be positioned for opening the switch 29. The switch 29 may alternatively be opened by applying a countervoltage to the coil 28 which is opposite to the response voltage U3, for example, using an additional voltage source, or by providing an additional coil through which, for example, a current flows in response to a switching pulse from the control room, and as a result, a magnetic field is generated which is suitable for opening the switch 29.

The response voltage U3 of the spark gap 26 is also the response voltage of the third protection stage 13 and is sized in such a way that it is greater than the response voltage U2 of the second protection stage 12. However, the third protection stage 13 could also act as the first failure level, and the first and second protection stages 11, 12 could act as its fallback levels. The response voltage U3 would then have to be sized smaller than the response voltage U1.

Should an overvoltage occur if both the first and the second protection levels 11, 12 have failed, or if an overvoltage results in a successive failure of the first and second protection levels 11, 12, the third protection level 13 would short-circuit the measuring connection 4 if the overvoltage exceeds the response voltage U3. Since mechanical switches are able to carry high currents and are considered to be robust and failsafe, such a third protection stage 13 constitutes a high level of protection of the measuring connection 4 from overvoltages. However, unlike in the first or second protection stage 11, 12, here, a manual intervention for opening the short circuit is necessary; therefore, the third protection stage 13 is preferably used as failure protection for the first and second protection stages 11, 12.

Figure 4:
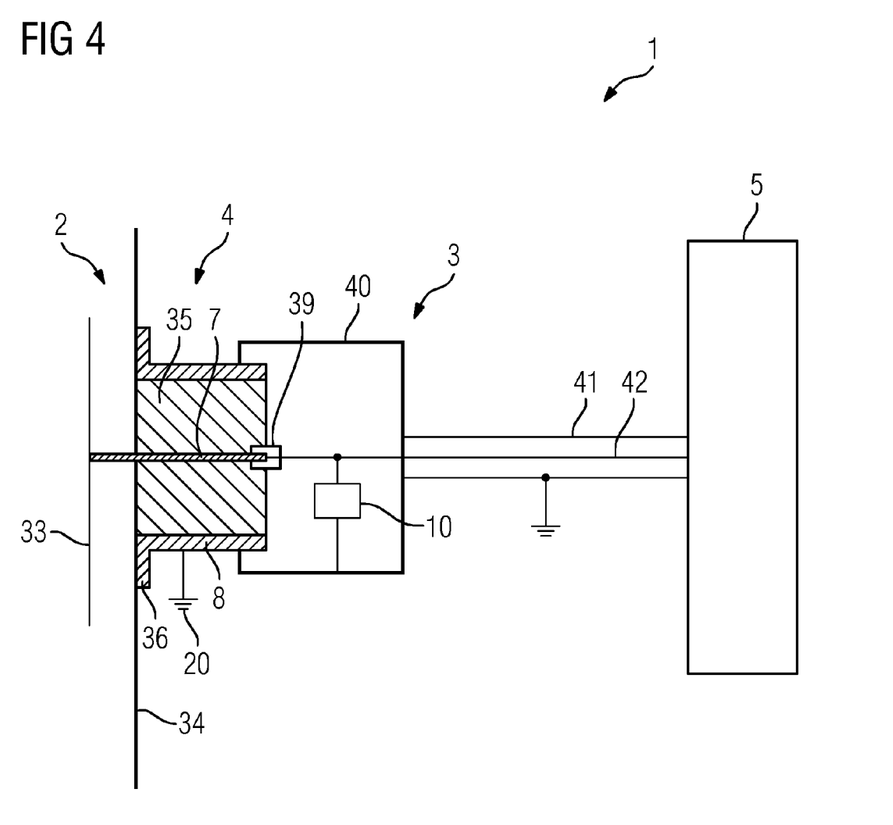
FIG. 4 a diagram of one embodiment of a measuring system according to the present invention.

FIG. 4 depicts a diagram of a measuring system 1 according to the present invention including a protection circuit 10 which is integrated into the housing 40 of the connecting plug 3. The protection circuit 10 may be designed as shown in FIG. 3. An electrical connection runs from the ground coating 33 of the high-voltage bushing 2 to the high-voltage terminal 7 of the measuring connection 4. A grounded flange 36 on the bushing housing 34 forms the outer housing of the measuring connection 4 and thus its ground terminal 8. An insulator 35 is present between the high-voltage terminal 7 and the outer housing which insulates the high-voltage terminal 7 from ground 20 and simultaneously seals the measuring connection 4, so that no air or moisture is able to reach the high-voltage bushing 2. The connecting plug 3 is plugged into the measuring connection 4. A socket 39 in the connecting plug 3 establishes the electrical connection to the high-voltage terminal 7. The housing 40 of the connecting plug 3 is electrically conductive and establishes the connection to ground 20 via the flange 36. The protection circuit 10 is situated in the interior of the housing 40 of the connecting plug 3. A protection circuit 10 as described above is made up of components which are highly compact, some being less than one millimeter in size. As a result, a protection circuit 10 having two or three protection stages 11, 12, 13 is able to be accommodated in a connecting plug 3 whose dimensions are limited by an often small amount of space in the area of the measuring connection 4. The protection circuit 10 is electrically connected in the interior of the connecting plug 3 to the socket 39 and to ground 20 via the housing 40 of the connecting plug 3. The connecting cable 6 is situated on the side of the connecting plug 3 facing away from the measuring connection 4. This cable is designed as a coaxial cable. The inner conductor 42 is electrically connected to the high-voltage terminal 7, and the outer conductor 41 is connected to ground 20 via the housing of the connecting plug 3. The connection may be designed to be fixed or detachable, for example, having a bayonet connector. The other end of the connecting cable 6 is connected to the measuring circuit 5. This connection may also be designed to be fixed or detachable.

The invention claimed is:

1. A measuring system for continuously monitoring a high-voltage bushing, the measuring system comprising:
a measuring circuit for monitoring the high-voltage bushing;
a connecting plug for connecting said measuring circuit to a measuring connection of the high-voltage bushing;
a connecting cable for connecting said measuring circuit to said connecting plug; and
a protection circuit for protecting said measuring connection from over voltages, said protection circuit being configured to establish a short circuit between a high-voltage terminal and a ground terminal of the measuring connection if an overvoltage occurs;
said protection circuit including a first protection stage, a second protection stage electrically connected in parallel with said first protection stage, and a third protection stage;
said first protection stage including a low-pass filter;
said second protection stage being disposed between the measuring connection and said first protection stage;
said first protection stage having a first response voltage and said second protection stage having a second response voltage greater than the first response voltage;
said third protection stage being connected in parallel with the measuring connection and disposed between the measuring connection and said first protection stage, and said third protection stage includes a mechanical switch for establishing the short circuit if a third response voltage is present.

2. The measuring system according to claim 1, wherein said first protection stage has a circuit branch connecting the high-voltage terminal to the ground terminal and including a varistor or a suppressor diode.

3. The measuring system according to claim 1, wherein said second protection stage has a circuit branch connecting the high-voltage terminal to the ground terminal and including a spark gap.

4. The measuring system according to claim 1, wherein said third protection stage includes a series circuit of a spark gap, a rectifier, and a coil, and wherein said mechanical switch is switchable via a current flow through said coil and forms together with said coil a reed relay.

5. The measuring system according to claim 4, wherein the reed relay is a bistable relay.

6. The measuring system according to claim 1, wherein at least one of said first, second, and third protection stage is configured to be redundant.

7. The measuring system according to claim 1, wherein said protection circuit is integrated into said connecting plug.

8. The measuring system according to claim 1, wherein the high-voltage bushing being monitored is a high-voltage bushing of a power transformer.

* * * * *